United States Patent
Zhang

(10) Patent No.: US 7,986,932 B1
(45) Date of Patent: Jul. 26, 2011

(54) FIXED POINT FIR FILTER WITH ADAPTIVE TRUNCATION AND CLIPPING AND WIRELESS MOBILE STATION USING SAME

(75) Inventor: Tao Zhang, Fremont, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 1272 days.

(21) Appl. No.: 10/299,730

(22) Filed: Nov. 19, 2002

(51) Int. Cl.
*H04B 1/10* (2006.01)

(52) U.S. Cl. ..... 455/307; 455/126; 455/213; 455/232.1; 455/340; 455/341

(58) Field of Classification Search ............... 455/307, 455/293, 299, 339, 340, 213, 126, 232.1, 455/341, 73, 111–113, 114.3, 216, 235.1, 455/240.1, 242.1, 243.1, 245.1, 253.1; 348/691, 348/571, 607; 375/232, 229, 235, 350; 708/323
See application file for complete search history.

(56) References Cited

U.S. PATENT DOCUMENTS

| | | | | |
|---|---|---|---|---|
| 5,493,343 A | * | 2/1996 | Knutson et al. | 348/691 |
| 5,621,763 A | * | 4/1997 | Walczak et al. | 375/312 |
| 5,696,710 A | * | 12/1997 | Hague et al. | 708/551 |
| 5,798,954 A | * | 8/1998 | Ishibata | 708/320 |
| 5,870,431 A | * | 2/1999 | Easton et al. | 375/230 |
| 6,047,024 A | * | 4/2000 | How | 375/229 |
| 6,131,105 A | * | 10/2000 | Pajarre et al. | 708/319 |
| 6,141,671 A | * | 10/2000 | Adams et al. | 708/313 |
| 6,301,596 B1 | * | 10/2001 | Karanovic | 708/319 |
| 6,389,069 B1 | * | 5/2002 | Mathe | 375/232 |
| 6,678,709 B1 | * | 1/2004 | Gandhi et al. | 708/319 |
| 6,868,263 B2 | * | 3/2005 | Filipovic | 455/245.1 |
| 2002/0051502 A1 | * | 5/2002 | Mathe | 375/316 |
| 2004/0233086 A1 | * | 11/2004 | Kiss et al. | 341/143 |

* cited by examiner

*Primary Examiner* — Pablo N Tran

(57) ABSTRACT

A fixed point finite impulse response (FIR) filter comprising: 1) an input stage for receiving an input signal as a sequence of input samples comprising: i) delay elements connected in series for receiving and shifting N sequential input samples; ii) multipliers, each multiplier receiving a selected one of the N sequential input samples from the delay elements and multiplying the selected input sample by a corresponding coefficient to produce an intermediate product; and iii) a summer for receiving and adding N intermediate products from the multipliers to produce an output sum signal comprising a sequence of output sum samples; and 2) an output stage for truncating k least significant bits (LSBs) from each of the output sum samples, wherein k is a variable number.

20 Claims, 7 Drawing Sheets

FIXED POINT FIR FILTER WITH ADAPTIVE TRUNCATION AND CLIPPING AND WIRELESS MOBILE STATION USING SAME

TECHNICAL FIELD OF THE INVENTION

The present invention is generally directed to communication devices, and more specifically, to a finite impulse response (FIR) filter that uses adaptive truncation and clipping in a wireless communication device.

BACKGROUND OF THE INVENTION

In conventional wireless code division multiple access (WCDMA) systems, the power of the adjacent channel could be as much as 40.7 dB higher than the in-band signal power received by the base station or mobile station. This significant difference requires that conventional baseband matched filters have a large dynamic range. Conventional fixed point finite impulse response (FIR) filters typically implement truncation and clipping scheme after the correlation block. The truncation and clipping scheme truncates a fixed number of the least significant bits from the correlator outputs and clips the signal peaks at some fixed saturation level. However, to cope with the large dynamic range of the filter input, conventional fixed point FIR filters typically use more output bits than are required in order to avoid system performance degradation. This problem is unique to fixed point FIR filters, since floating point FIR filters do not require clipping and truncation circuits.

Therefore, there is a need in the art for an improved finite impulse response (FIR) filter that is capable of processing input signals having a potentially large dynamic range without requiring the use of a large number of extra filter output bits to retain system performance. In particular, there is a need in the art for an improved FIR filter having reduced complexity that is able to process input signals having large dynamic ranges wherein size of the FIR filter outputs are optimized for the in-band signal power.

SUMMARY OF THE INVENTION

To address the above-discussed deficiencies of the prior art, it is a primary object of the present invention to provide an improved fixed point finite impulse response (FIR) filter. According to an advantageous embodiment of the present invention, the fixed point FIR filter comprises: 1) an input stage capable of receiving an input signal as a sequence of input samples, the input stage comprising: i) a plurality of delay elements connected in series capable of receiving and shifting N sequential input samples; ii) a plurality of multipliers, each of the multipliers capable of receiving a selected one of the N sequential input samples from the plurality of delay elements and multiplying the selected input sample by a corresponding coefficient to thereby produce an intermediate product; and iii) a summer capable of receiving and adding N intermediate products from the plurality of multipliers to thereby produce an output sum signal comprising a sequence of output sum samples; and 2) an output stage capable of truncating k least significant bits (LSBs) from each of the output sum samples, wherein k is a variable number, to thereby produce a sequence of filtered output samples.

According to one embodiment of the present invention, the output stage comprises: 1) a variable gain amplifier capable of multiplying each of the output sum samples by a variable gain factor to produce a sequence of shifted output samples, wherein a most significant bit of the each output sum sample is shifted a variable amount to a desired bit position; and 2) a feedforward gain controller capable of determining a power of the each output sum sample and, in response to the determination, adjusting the variable gain factor.

According to another embodiment of the present invention, the output stage comprises: 1) a variable gain amplifier capable of multiplying each of the output sum samples by a variable gain factor to produce a sequence of shifted output samples, wherein a most significant bit of the each output sum sample is shifted a variable amount to a desired bit position; and 2) a feedback gain controller capable of determining a power of each filtered output sample and, in response to the determination, adjusting the variable gain factor so that an optimum number of the filtered output samples are saturated.

According to still another embodiment of the present invention, the output stage comprises: 1) a variable truncation unit capable of truncating a variable number, k, of least significant bits from each of the output sum samples to thereby produce a sequence of truncated samples; and 2) a feedforward gain controller capable of controlling the variable truncation unit, wherein the feedforward gain controller determines a power of the each output sum sample and, in response to the determination, adjusts the variable number, k.

According to yet another embodiment of the present invention, the output stage comprises: 1) a variable truncation unit capable of truncating a variable number, k, of least significant bits from each of the output sum samples to thereby produce a sequence of truncated samples; and 2) a feedback gain controller capable of controlling the variable truncation unit, wherein the feedback gain controller determines a power of the each filtered output sample and, in response to the determination, adjusts the variable number, k.

According to a further embodiment of the present invention, the output stage further comprises a truncation unit capable of receiving the sequence of shifted output samples from the variable gain amplifier and truncating a fixed number of least significant bits from each shifted output sample to thereby produce a sequence of truncated samples.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts.

DETAILED DESCRIPTION OF THE INVENTION

FIGS. 1 through 7, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged wireless communication system.

Figure 1:
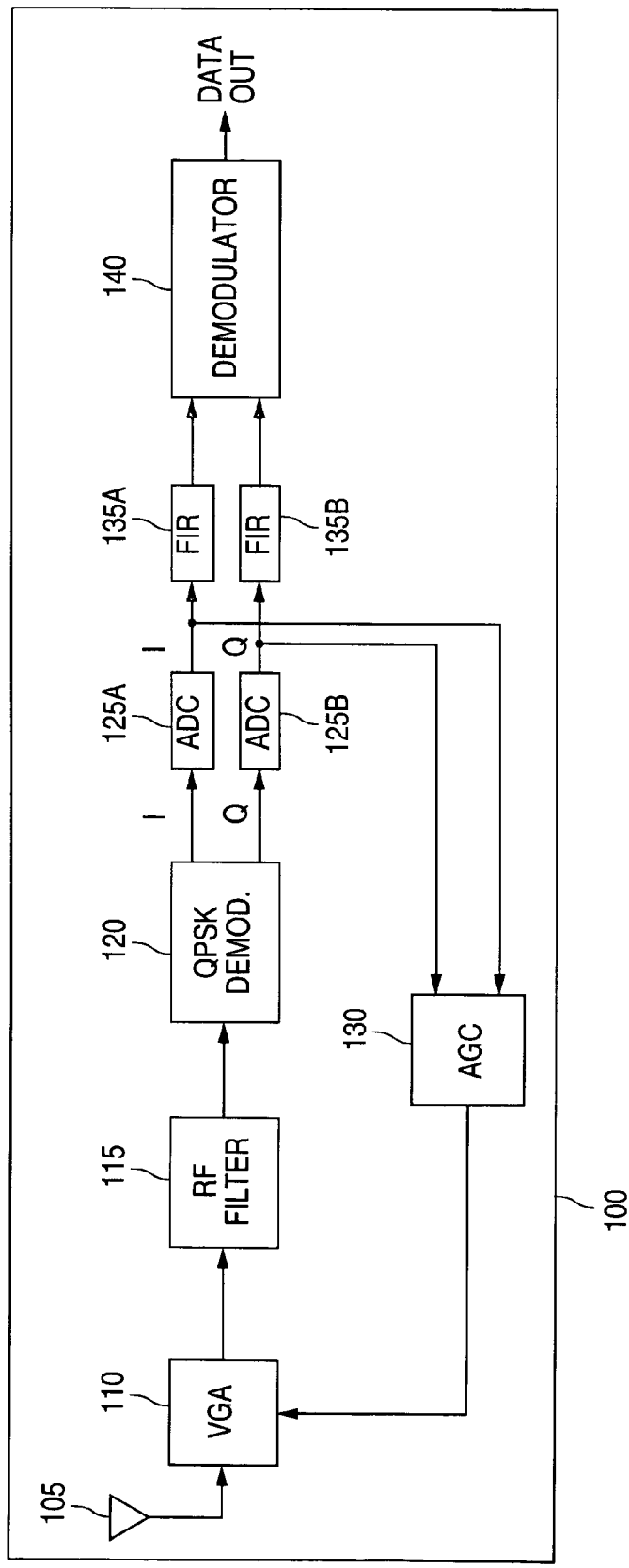
FIG. 1 illustrates a wireless communication device according to an exemplary embodiment of the present invention.

FIG. 1 illustrates wireless communication device 100 according to an exemplary embodiment of the present invention. Wireless communication device 100 is intended to be a generic representation of any type of receiver that may contain a fixed point finite impulse response (FIR) filter using adaptive truncation according to the principles of the present invention. Thus, in one embodiment of the present invention, wireless communication device 100 shown in FIG. 1 may be a portion of a cellular telephone or a portion of a base station of a wireless network. In an alternate embodiment of the present invention, wireless communication device 100 may be part of a wireless network card in a personal computer (PC) operating in, for example, an IEEE 802.11 compatible wireless local area network (LAN). Those skilled in the art will recognize that the particular details set forth below with respect to wireless communication device 100 are by way of example only and should not be construed so as to limit the scope of the present invention.

The receive path of wireless communication device 100 comprises antenna 105, variable gain amplifier (VGA) 110, radio frequency (RF) filter 115, quadrature phase shift keying (QPSK) demodulator 120, analog-to-digital-converters 125A and 125B, and automatic gain control (AGC) block 130. The receive path of wireless communication device 100 also comprises fixed point finite impulse response (FIR) filters 135A and 135B and demodulator block 140.

Variable gain amplifier (VGA) 110 amplifies the incoming RF signal receive from antenna 105 by an amount determined by gain control signal receive from AGC control block 130. RF filter 115 then filters the output of VGA 110. According to an exemplary embodiment of the present invention, RF filter 115 may be any one of several infinite impulse response (IIR) filters that have the primary function of isolating the frequencies of interest (i.e., band selection, channel selection, low-pass filtering) and perform anti-aliasing for ADC-sampling.

QPSK demodulator 120 then demodulates the filtered RF signal to produce an intermediate frequency (IF) signal or a baseband signal. According to an exemplary embodiment of the present invention, the incoming RF signal is a quadrature phase-shift keying (QPSK) signal and the outputs of QPSK demodulator 120 are an in-phase (I) output signal and a quadrature (Q) output signal. The in-phase (I) output signal from QPSK demodulator 120 is converted from an analog signal to a digital signal by analog-to-digital converter (ADC) 125A. The quadrature (Q) output signal from QPSK demodulator 120 is converted from an analog signal to a digital signal by analog-to-digital converter (ADC) 125B.

The digitized I and Q output signals from ADC 125A and ADC 125B are fed back to AGC block 130. AGC block 130 functions in such a manner that the total power of the in-band signals and the out-of-band adjacent channel signals are maintained at a constant level at the outputs of ADC 125A and ADC 125B. The power of the in-band signals at the outputs of ADC 125A and 125B is kept constant by AGC block 130 even if there are strong adjacent channel signals.

The outputs of ADC 125A and ADC 125B are filtered by fixed point FIR filter 135A and fixed point FIR filter 135B, respectively. FIR filter 135A and FIR filter 135B are matched filters, so that only the in-band signals remain at the outputs of FIR filter 135A and FIR filter 135B. Since the strengths of the in-band signals at the outputs of ADC 125A and 125B vary according to the strength of the adjacent channel signals, the power of signals at the outputs of FIR filter 135A and FIR filter 135B also vary.

Advantageously, since RF filter 115 is typically a $3^{rd}$ or $4^{th}$ order Butterworth filter or Chebycheshev filter that provides only about 18-24 dB attenuation at the center of the adjacent channel, fixed point FIR filter 135A and fixed point FIR filter 135B also act as an adjacent channel selectivity filters that provide about 40 dB attenuation at the center of the adjacent channel.

Next, demodulator 140 demodulates the in-phase baseband signal to thereby recover the symbols of the in-phase baseband signal. Similarly, demodulator 140 demodulates the quadrature baseband signal to thereby recover the symbols of the quadrature baseband signal. The recovered symbols comprise the Data Out signal at the output of demodulator 140.

Figure 2:
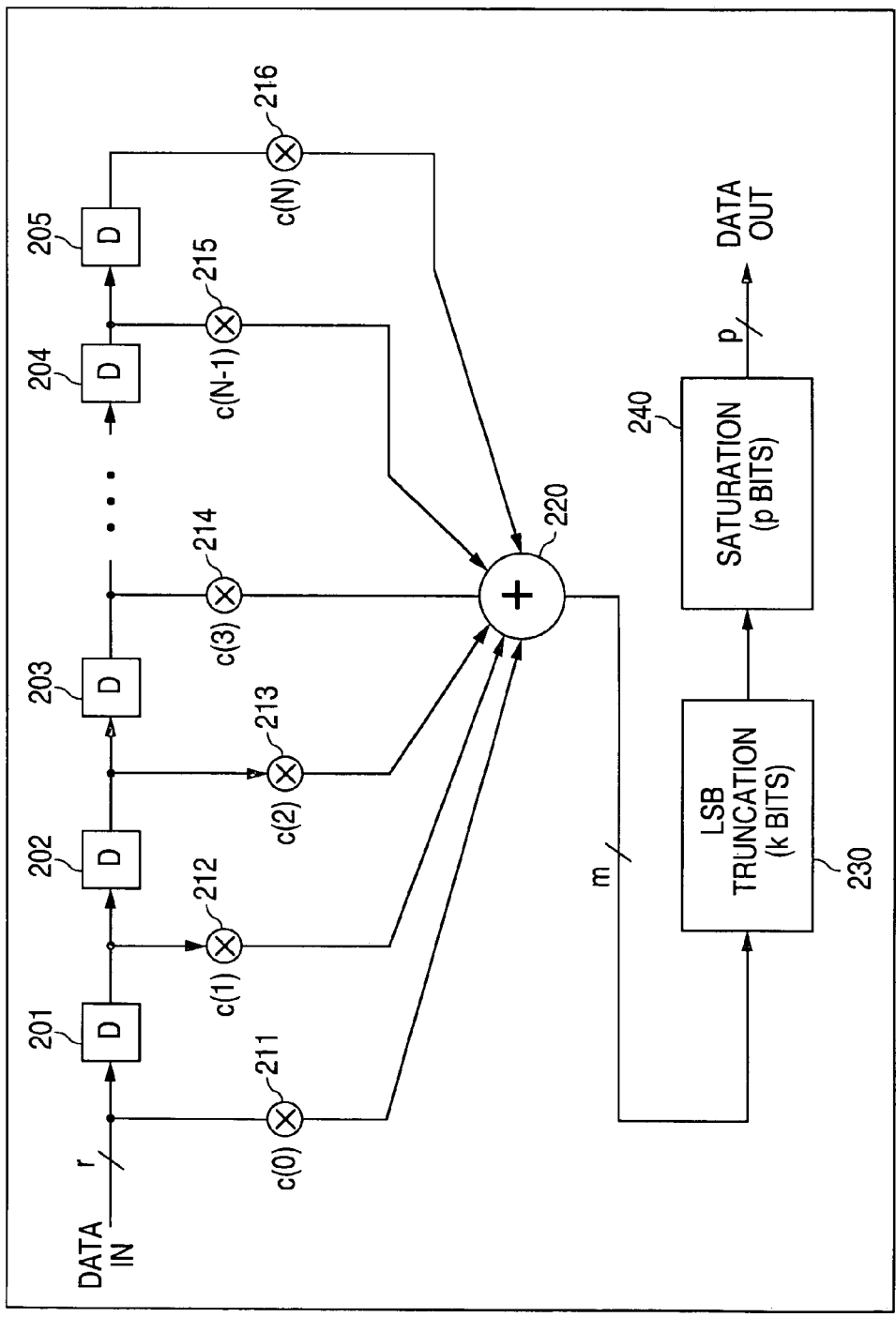
FIG. 2 illustrates a finite impulse response (FIR) filter according to an exemplary embodiment of the prior art.

FIG. 2 illustrates fixed point finite impulse response (FIR) filter 200 according to an exemplary embodiment of the prior art. Prior art FIR filter 200 may be used in place of FIR filter 135A and FIR filter 135B in FIG. 1. FIR filter 200 comprises a chain of N−1 sequential delay (D) elements, including exemplary delay (D) elements 201, 202, 203, 204 and 205. FIR filter 200 also comprises N multipliers, including exemplary multipliers 211, 212, 213, 214, 215 and 216. FIR filter 200 also comprises summer 220, least significant bit (LSB) truncation block 230 and saturation block 240.

The Data In signal received from ADC 125A or ADC 125B comprises a sequence of r-bit digital samples. These r-bit digital samples shift sequentially through the N−1 delay elements, including exemplary delay elements 201-205. The N multipliers, including exemplary multipliers 211-216 multiply N sequential samples of the Data In signal by the N filter coefficients $c(0), c(1), \ldots c(N-1)$, and $c(N)$.

The intermediate signal at the output of summer 220 comprises a sequence of m-bit digital samples, where m is greater than r. For example, in an exemplary embodiment of the present invention, r may be 6 bits and m may be from 17 bits to 20 bits. In order to reduce the complexity of FIR filter 200 and subsequent stages of wireless communication device 100, LSB truncation block 230 truncates (i.e., cuts off) the k least significant bits from the m-bit intermediate signal received from summer 220. Saturation block 240 compares the (m−k)-bit truncated output from LSB truncation block 230 to a maximum threshold and a minimum threshold and outputs a p-bit output at the Data Out signal. If the (m−k)-bit truncated output from LSB truncation block 230 exceeds the maximum threshold, saturation block 230 outputs a maximum saturation value. It the (m−k)-bit truncated output from LSB truncation block 230 is less than the minimum threshold, saturation block 230 outputs a minimum saturation value.

For example, let m=17, k=8 and p=6. LSB truncation block 230 drops the nine (9) least significant bits from the 17-bit intermediate signal from summer 220 and outputs a (17−8) =9-bit value to saturation block 240. The range of the 6-bit output (p=6) from saturation block 240 is from +31 to −32. Saturation block 240 compares each 9-bit value from LSB truncation block 230 to +31 and −32. If the 9-bit value from LSB truncation block 230 is greater than +31, saturation block 240 outputs a maximum saturation value equal to +31 (i.e., 011111 in 2s-complement). If the 9-bit value from LSB truncation block 230 is less than −32, saturation block 240 outputs a minimum saturation value equal to −31 (i.e., 111111 in 2s-complement). If the 9-bit value from LSB truncation block 230 is between +31 and −32 inclusive, saturation block 240 outputs a 6-bit value equal to the 9-bit output of LSB truncation block 230.

However, the wide dynamic range of the m-bit output from summer 220 causes problems in the performance of wireless communication device 100. The above-described operation of FIR filter 200 provides a quantization window having a width of p bits at bit position k. Given a signal power of m bits at the output of summer 220 and a Data Out signal of p bits, the higher the quantization window, the more rounding noise, and the lower the quantization window, the more overflow noise.

There is an optimal window position for the given power of the input signal of m bits at the output of summer 220. However, while this optimal window position may change, conventional fixed point FIR filter designs use quantization windows that have a fixed width and a fixed bit position. This leads to performance degradation. The present invention overcomes this problem by providing an apparatus that is capable of performing adaptive truncation, wherein the value of k may be modified in order to truncate a variable number of bits from the output of summer 220.

Figure 3:
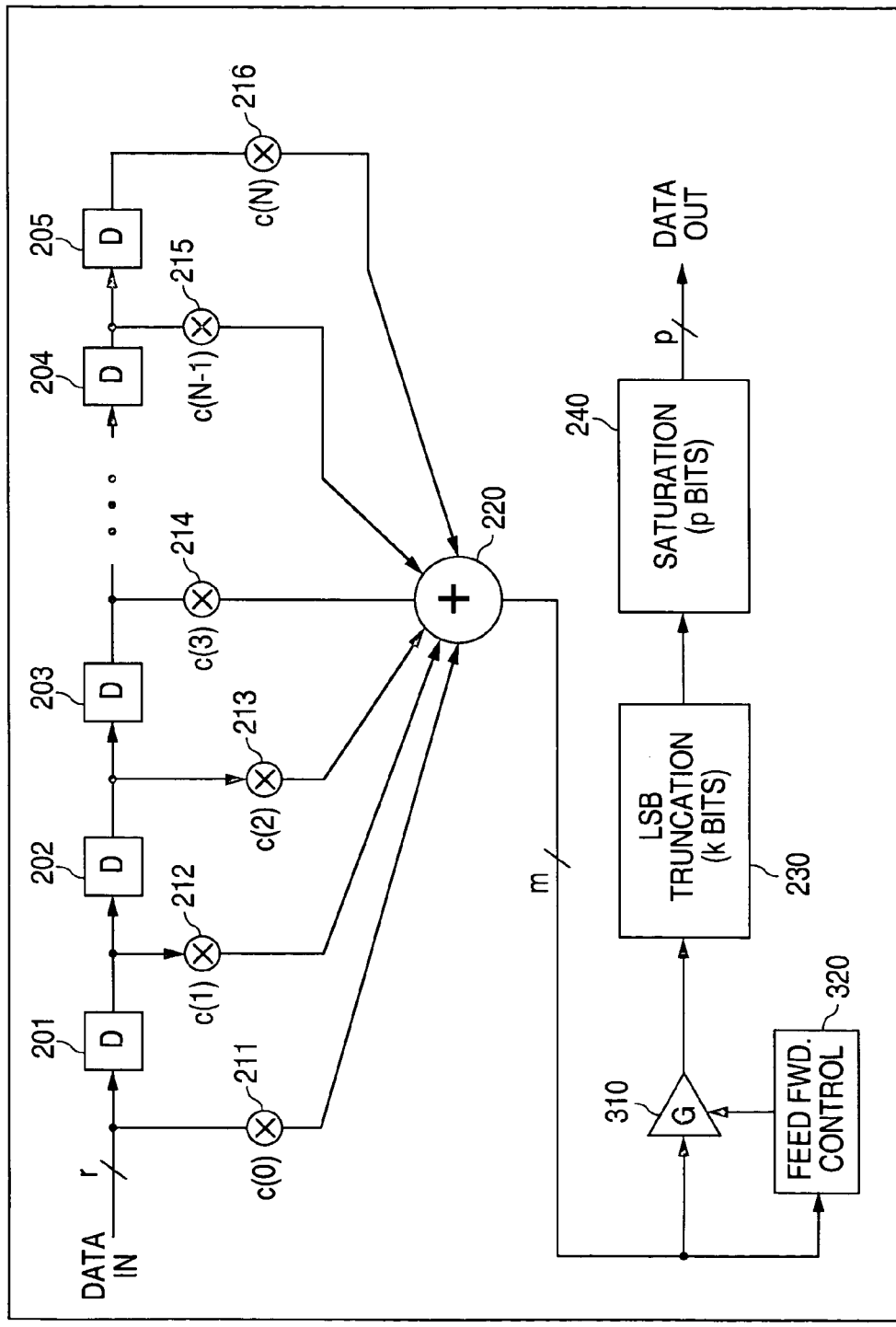
FIG. 3 illustrates a finite impulse response (FIR) filter according to a first exemplary embodiment of the present invention.

FIG. 3 illustrates fixed point finite impulse response (FIR) filter 135 according to a first exemplary embodiment of the present invention. FIR filter 135 represents one or both of fixed point FIR filters 135A and 135B in FIG. 1. FIR filter 135 comprises a chain of N−1 sequential delay (D) elements (e.g., shift registers), including exemplary delay (D) elements 201, 202, 203, 204 and 205. FIR filter 135 also comprises N multipliers, including exemplary multipliers 211, 212, 213, 214, 215 and 216. FIR filter 135 also comprises summer 220, variable gain amplifier 310, feed-forward control block 320, least significant bit (LSB) truncation block 230 and saturation block 240. The input stages of FIR filter 135, up to and including summer 220, operate identically to the input stages of FIR filter 200 and need not be discussed in detail again.

However, the m-bit output of summer 220 is multiplied by a variable amount of gain by variable gain amplifier 310 before being applied to LSB truncation block 230. The amount of gain is controlled by feed-forward control block 320. Feed-forward control block 320 measures the signal strength of the m-bit output of summer 220 and adjusts the gain (G) of amplifier 310 in order to keep the power of the samples entering LSB truncation block 230 in a desired target range.

For example, if a p=6 bit output (including sign bit) is desired for the Data Out signal and k=7 bits of truncation, then feed-forward control block 320 adjusts the gain of amplifier 310 (up or down), so that the most significant bits of the peaks of the samples entering LSB truncation block 230 are approximately bit positions 12 or 13, or perhaps bit position 14 (disregarding occasional very large peaks). After the k=7 least significant bits are dropped, the peak values entering LSB truncation block 230 will have their most significant bits in bit positions 5 or 6, or perhaps bit position 7 (not counting the sign bit). In this manner, most samples at the output of saturation block 240 make full use of the range between +31 and −32 in value without a large number of saturation values being generated.

Figure 4:
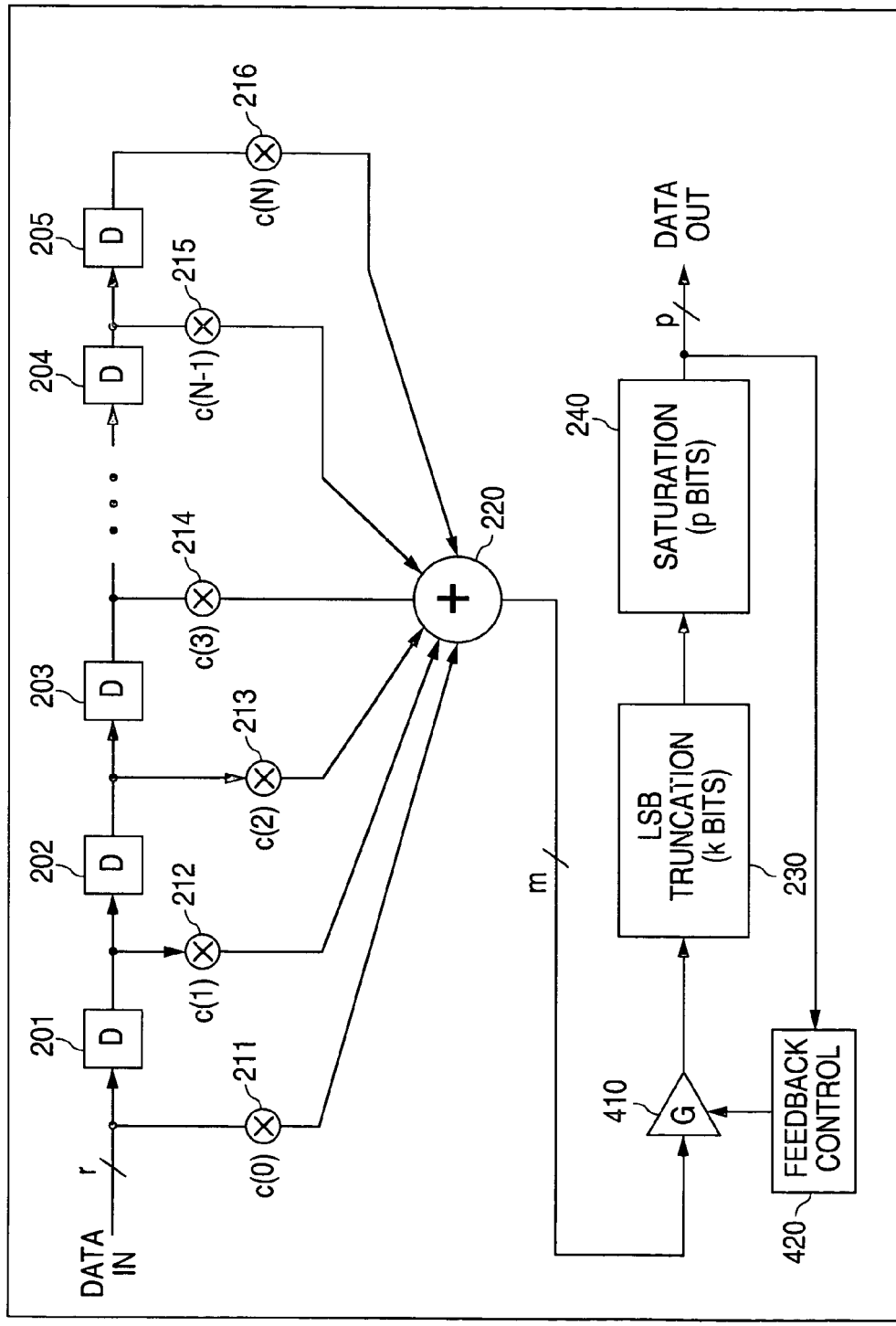
FIG. 4 illustrates a finite impulse response (FIR) filter according to a second exemplary embodiment of the present invention.

FIG. 4 illustrates finite impulse response (FIR) filter 135 according to a second exemplary embodiment of the present invention. As in FIG. 3, FIR filter 135 comprises a chain of N−1 sequential delay (D) elements, including exemplary delay (D) elements 201, 202, 203, 204 and 205. FIR filter 135 also comprises N multipliers, including exemplary multipliers 211, 212, 213, 214, 215 and 216. FIR filter 135 also comprises summer 220, variable gain amplifier 410, feedback control block 420, least significant bit (LSB) truncation block 230 and saturation block 240. The input stages of FIR filter 135, up to and including summer 220, operate identically to the input stages of FIR filter 200 and need not be discussed in detail again.

As in the case of FIR filter 125 in FIG. 3, the m-bit output of summer 220 is multiplied by a variable amount of gain by variable gain amplifier 410 before being applied to LSB truncation block 230. However, the amount of gain is controlled by feedback control block 420 (rather than a feedforward controller). Feedback control block 420, discussed below in greater detail, measures the signal strength of the p-bit output saturation block 240 to determine the number of output samples that are saturated and adjusts the gain (G) of amplifier 410 in order to keep the power of the samples entering LSB truncation block 230 in a desired target range. The desired target range reduces the number of output samples in Data Out that are saturated to an optimum level.

Figure 5:
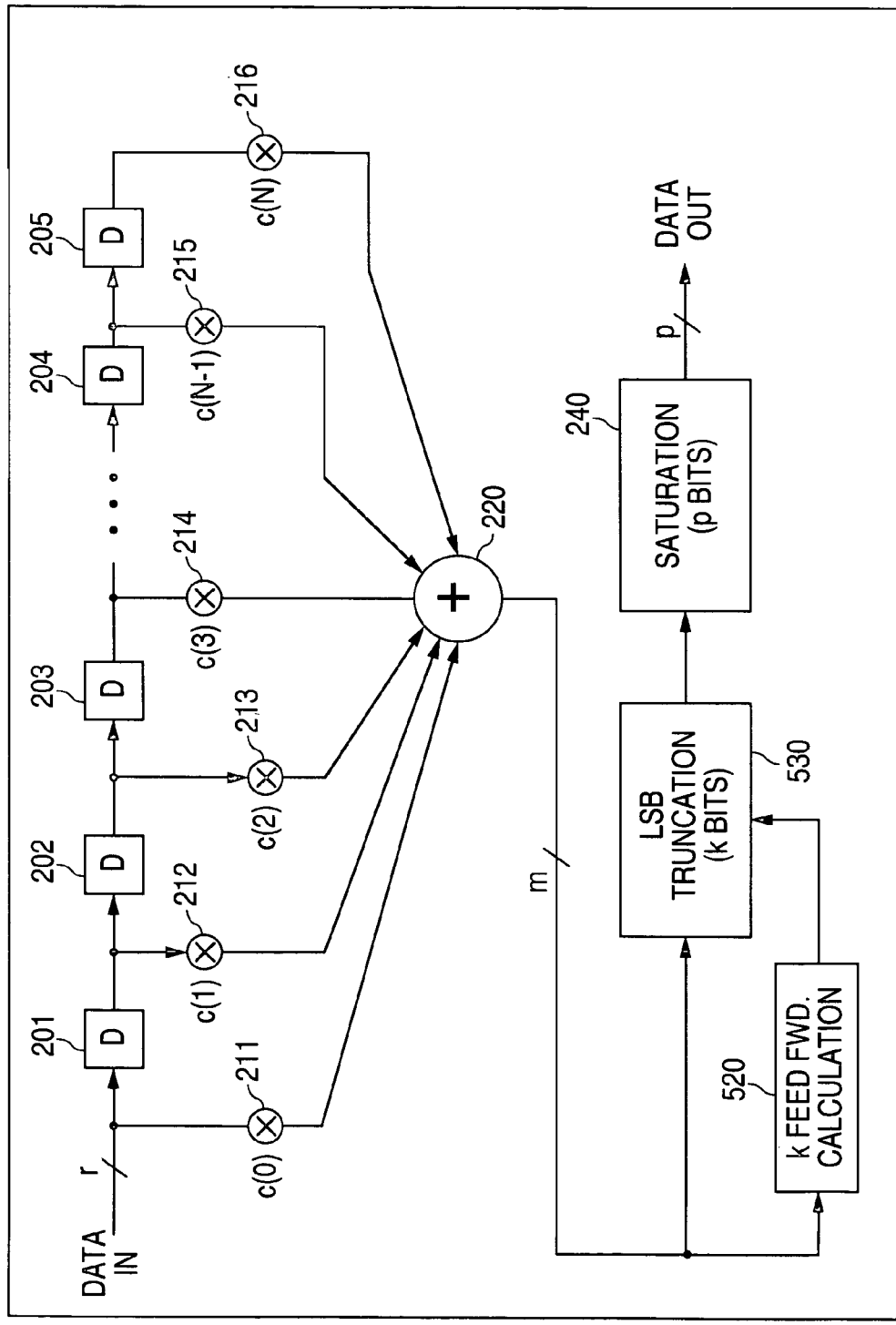
FIG. 5 illustrates a finite impulse response (FIR) filter according to a third exemplary embodiment of the present invention.

FIG. 5 illustrates finite impulse response (FIR) filter 135 according to a third exemplary embodiment of the present invention. As in FIGS. 3 and 4, FIR filter 135 comprises a chain of N−1 sequential delay (D) elements, including exemplary delay (D) elements 201, 202, 203, 204 and 205. FIR filter 135 also comprises N multipliers, including exemplary multipliers 211, 212, 213, 214, 215 and 216. FIR filter 135 further comprises summer 220, feed-forward calculation block 520, least significant bit (LSB) truncation block 530 and saturation block 240. The input stages of FIR filter 135, up to and including summer 220, operate identically to the input stages of FIR filter 200 and need not be discussed in detail again.

The m-bit output of summer 220 is applied directly to the input of LSB truncation block 530 (i.e., without gain amplification). However, unlike the above-described LSB truncation block 230, LSB truncation block 530 truncates a variable number, k, of least significant bits from the m-bit output of summer 220. The value of k is determined by feed-forward calculation block 520. Feed-forward calculation block 520, discussed below in greater detail, measures the signal strength of the m-bit output of summer 220 and adjusts the value of k in LSB truncation block 530 so that the power of the samples exiting LSB truncation block 530 are in a desired target range.

Figure 6:
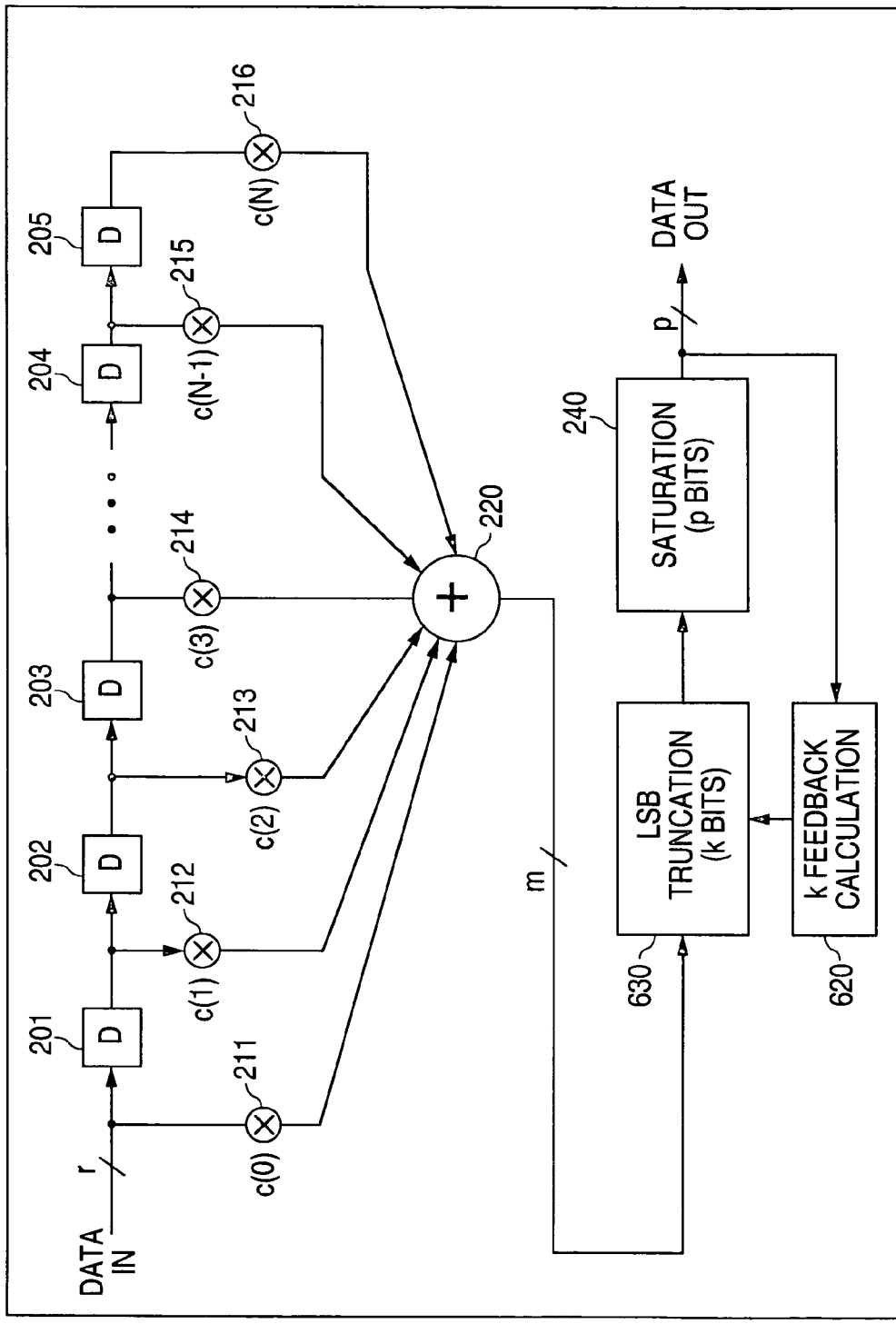
FIG. 6 illustrates a finite impulse response (FIR) filter according to a fourth exemplary embodiment of the present invention.

FIG. 6 illustrates finite impulse response (FIR) filter 135 according to a fourth exemplary embodiment of the present invention. As in FIGS. 3-5, FIR filter 135 comprises a chain of N−1 sequential delay (D) elements, including exemplary delay (D) elements 201, 202, 203, 204 and 205. FIR filter 135 also comprises N multipliers, including exemplary multipliers 211, 212, 213, 214, 215 and 216. FIR filter 135 further comprises summer 220, feedback calculation block 620, least significant bit (LSB) truncation block 630, and saturation block 240. The input stages of FIR filter 135, up to and including summer 220, operate identically to the input stages of FIR filter 200 and need not be discussed in detail again.

The m-bit output of summer 220 is applied directly to the input of LSB truncation block 630 (i.e., without gain amplification). LSB truncation block 630 truncates a variable number, k, of least significant bits from the m-bit output of summer 220. The value of k is determined by feedback calculation block 620. Feedback calculation block 620, discussed below in greater detail, measures the signal strength of the p-bit output saturation block 240 to determine the number of output samples that are saturated and adjusts the value of k in order to keep the power of the samples exiting LSB truncation block 630 in a desired target range. The desired target range reduces the number of output samples in Data Out that are saturated to an optimum level.

Figure 7A:
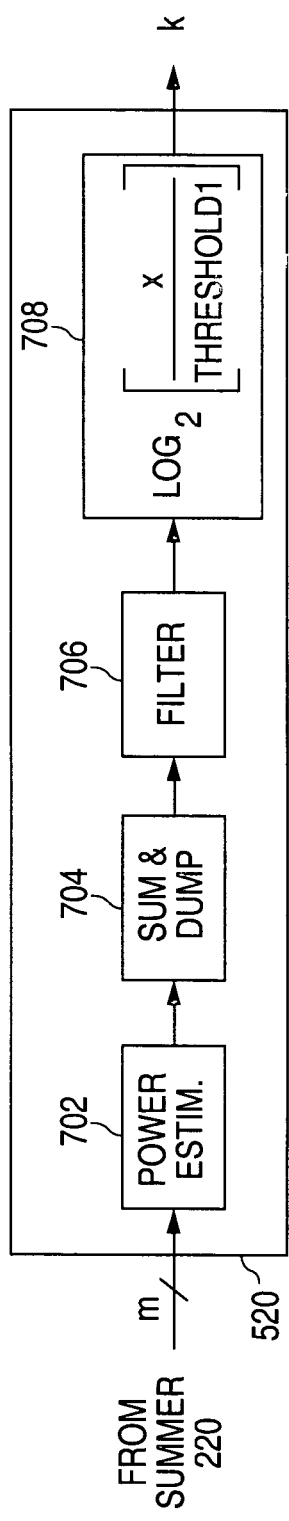
FIG. 7A illustrates a feed-forward calculation block for adaptively determining the truncation value according to an exemplary embodiment of the present invention.

FIG. 7A illustrates feed-forward calculation block 520 for adaptively determining the truncation value, k, according to an exemplary embodiment of the present invention. Feed-forward calculation block 520 receives the m-bit outputs of summer 220 and periodically generates values of k. It is noted that feed-forward control block 320 functions in a manner that corresponds to the following description of feed-forward calculation block 520, except that feed-forward control block 320 generates values of gain, G, that are used by amplifier 310.

Feed-forward calculation block 520 comprises power estimation block 702, sum and dump block 704, filter 706, and $\log_2$ [X/Threshold1] block 708. Power estimation block 702 receives the m-bit samples from summer 220 and calculates the power of the samples. Power estimation block 702 may take the absolute value or square value of the signal as the power estimate. Sum and dump block 704 receives the power estimate values from power estimation block 702, adds consecutive groups of W power estimate values together, divides each sum by W, and outputs the results. In essence, sum and dump block 704 calculates the average value of each group of W consecutive power estimate values received from power estimation block 702. Thus, the data rate at the output of sum and dump block 704 is 1/W the data rate at the output of power estimation block 702.

Filter 706 then filters the average values from the output of sum and dump block 704 to reduce noise and jitter. The smoothed and filtered output of filter 706 is then applied to $\log_2$ [X/Threshold1] block 708. In an exemplary embodiment of the present invention, the value X represents the bit weight of the most significant bit in the output of filter 706. For example, if the output of filter 706 is 0000010000001000 binary (1032 decimal), the $11^{th}$ bit is the most significant bit and X equals 1024. The pre-determined Threshold1 value is set so that the correct number of bits, k, are truncated from the output of filter 1024 for a target power output level.

For example, if Threshold1=64 and X=1024, then [X/Threshold1] equals 16 and the output of $\log_2$ [X/Threshold] block 708 is k=4. If the output of summer 220 is 0001010000001000 binary (5128 decimal) and four bits are truncated from the output of summer 220, then the input to saturation block 240 is the value 000101000000.

Figure 7B:
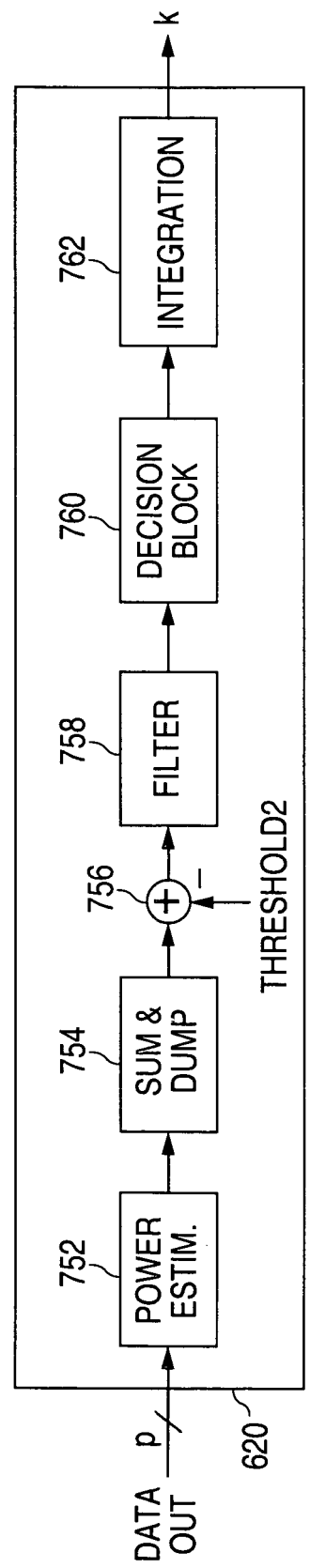
FIG. 7B illustrates a feedback calculation block for adaptively determining the truncation value according to an exemplary embodiment of the present invention.

FIG. 7B illustrates feedback calculation block 620 for adaptively determining the truncation value according to an exemplary embodiment of the present invention. Feedback calculation block 620 receives the p-bit outputs from saturation block 240 and periodically generates values of k. It is noted that feedback control block 420 functions in a manner that corresponds to the following description of feedback calculation block 620, except that feedback control block 420 generates values of gain, G, that are used by amplifier 410.

Feedback calculation block 620 comprises power estimation block 752, sum and dump block 754, adder 756, filter 758, decision block 760, and integration block 762. Power estimation block 752 receives the p-bit samples from saturation block 240 and calculates the power of the samples. Sum and dump block 754 receives the power estimate values from power estimation block 752, adds consecutive groups of W power estimate values together, divides each sum by W, and outputs the results. In essence, sum and dump block 754 calculates the average value of each group of W consecutive power estimate values received from power estimation block 752. Thus, the data rate at the output of sum and dump block 754 is 1/W the data rate at the output of power estimation block 752.

Next, adder 756 subtracts a pre-determined Threshold2 value from the power average values at the output of sum and dump block 754. The Threshold2 value in FIG. 7B is different than the Threshold1 value in block 708 in FIG. 7A. The output of adder 756 is an error value that may be equal to 0, may be greater or equal to 1, or may be less than or equal to −1. The error value from adder 756 is filtered and smoothed by filter 758. The output of decision block 760 has only three values: +1, 0, or −1. If the filtered error value is less than +(Threshold3) and greater than −(Threshold3), then the output of decision block 760 is 0. If the filtered error value is equal to +(Threshold3) or greater, then the output of decision block 760 is +1. If the filtered error value is equal to −(Threshold3) or less, then the output of decision block 760 is −1. The Threshold3 value in decision block 760 is different than the Threshold1 value in block 708 and the Threshold2 block in adder 756. The Threshold3 value is used to further remove jitter in output k. Thus, the output of decision block 760 is a sequence of +1, 0 and −1 values that are integrated by integration block 762. The output of integration block 762 is the value k.

If the p-bit output power from saturation block 240 are too high (i.e., frequent saturations), then the outputs of sum and dump block 754 are consistently higher than the Threshold value on the input of adder 756. As a result, the error values from adder 756 are consistently greater than or equal to +1 and the outputs of decision block 760 are mostly +1 values. This causes the output of integration block 762 to rise and the value of k increase. This results in a greater number of least significant bits being truncated from the output of summer 220 and the average power of the p-bit outputs of saturation block 240 decreases. Conversely, if the p-bit output values from saturation block 240 are too low, a smaller number of least significant bits are truncated from the output of summer 220 and the average power of the p-bit outputs of saturation block 240 increases.

In the embodiments illustrated above in FIGS. 3-6, the input stage of FIR filter 135 (i.e., delay elements 201-205, multipliers 211-216 and summer 220) is a direct form realization of an FIR filter. However, those skilled in the art will recognize that FIR filter 135 may be embodied as any type of FIR filter, including, for example, a transpose filter realization. Generally speaking, the input stage of any FIR filter receives input samples having a relatively small number of significant bits and generates outputs samples having a relatively large number of bits. Advantageously, adaptive truncation circuitry according to the principles of the present invention may be easily implemented with any type of FIR filter input stage.

Although the present invention has been described with an exemplary embodiment, various changes and modifications may be suggested to one skilled in the art. It is intended that the present invention encompass such changes and modifications as fall within the scope of the appended claims.

What is claimed is:

1. A fixed point finite impulse response (FIR) filter comprising:
   a filter input stage configured to receive an input signal as a sequence of input samples and to generate an intermediate signal comprising a sequence of filtered samples, wherein the filtered samples have a larger number of bits than the input samples; and
   an output stage configured to truncate k least significant bits from each of the filtered samples to generate a sequence of output samples, wherein the output stage is configured to perform adaptive truncation where a value of k is modified in order to truncate a variable number of least significant bits from the filtered samples during operation of the fixed point FIR filter;
   wherein the output stage comprises:
      a variable gain amplifier configured to multiply each of the filtered samples by a variable gain factor to generate a sequence of shifted samples, wherein a most significant bit of each filtered sample is shifted to a desired bit position; and
      a feedforward gain controller configured to determine a power of each filtered sample and, in response to the determination, adjust the variable gain factor.

2. The fixed point FIR filter as set forth in claim 1, wherein the output stage further comprises a truncation unit configured to receive the sequence of shifted samples from the variable gain amplifier and to truncate a fixed number of least significant bits from each shifted sample to thereby generate a sequence of truncated samples.

3. The fixed point FIR filter as set forth in claim 2, wherein the output stage further comprises a saturation unit configured to receive the sequence of truncated samples, clip ones of the truncated samples exceeding a positive maximum threshold at a positive saturation value, and clip ones of the truncated samples exceeding a negative maximum threshold value at a negative saturation value to thereby generate the sequence of output samples.

4. The fixed point FIR filter as set forth in claim 1, wherein the filter input stage comprises:
   multiple delay elements coupled in series, the delay elements configured to receive and shift the input samples.

5. The fixed point FIR filter as set forth in claim 1, wherein the filter input stage comprises:
   multiple multipliers configured to multiply the input samples by filter coefficients to generate intermediate products; and
   a summer configured to sum the intermediate products to generate the filtered samples.

6. The fixed point FIR filter as set forth in claim 1, wherein the FIR filter comprises N–1 delay elements coupled in series and N multipliers.

7. The fixed point FIR filter as set forth in claim 6, wherein the multipliers comprise:
   N–1 multipliers, each coupled to an input of one of the delay elements; and
   an $N^{th}$ multiplier coupled to an output of a last of the delay elements.

8. A wireless communication device comprising: 1) a radio frequency (RF) receiver front-end configured to receive an incoming RF signal and down-convert the incoming RF signal to a demodulated signal; and 2) a fixed point finite impulse response (FIR) filter configured to receive the demodulated signal as a sequence of input samples, the fixed point FIR filter comprising:
   a filter input stage configured to receive the input samples and to generate an intermediate signal comprising a sequence of filtered samples, wherein the filtered samples have a larger number of bits than the input samples; and
   an output stage configured to truncate k least significant bits from each of the filtered samples to generate a sequence of output samples, wherein the output stage is configured to perform adaptive truncation where a value of k is modified in order to truncate a variable number of least significant bits from the filtered samples during operation of the fixed point FIR filter;
   wherein the output stage comprises:
      a variable gain amplifier configured to multiply each of the filtered samples by a variable gain factor to generate a sequence of shifted samples, wherein a most significant bit of each filtered sample is shifted to a desired bit position; and
      a feedforward gain controller configured to determine a power of each filtered sample and, in response to the determination, adjust the variable gain factor.

9. The wireless communication device as set forth in claim 8, wherein the output stage further comprises a truncation unit configured to receive the sequence of shifted samples from the variable gain amplifier and to truncate a fixed number of least significant bits from each shifted sample to thereby generate a sequence of truncated samples.

10. The wireless communication device as set forth in claim 9, wherein the output stage further comprises a saturation unit configured to receive the sequence of truncated samples, clip ones of the truncated samples exceeding a positive maximum threshold at a positive saturation value, and clip ones of the truncated samples exceeding a negative maximum threshold value at a negative saturation value to thereby generate the sequence of output samples.

11. The wireless communication device as set forth in claim 8, wherein the filter input stage comprises:
   multiple delay elements coupled in series, the delay elements configured to receive and shift the input samples.

12. The wireless communication device as set forth in claim 8, wherein the filter input stage comprises:
   multiple multipliers configured to multiply the input samples by filter coefficients to generate intermediate products; and
   a summer configured to sum the intermediate products to generate the filtered samples.

13. The wireless communication device as set forth in claim 8, wherein the FIR filter comprises N–1 delay elements coupled in series and N multipliers.

14. The wireless communication device as set forth in claim 13, wherein the multipliers comprise:
   N–1 multipliers, each coupled to an input of one of the delay elements; and
   an $N^{th}$ multiplier coupled to an output of a last of the delay elements.

15. A method, comprising:
receiving an input signal as a sequence of input samples;
generating an intermediate signal comprising a sequence of filtered samples, wherein the filtered samples have a larger number of bits than the input samples; and
truncating k least significant bits from each of the filtered samples to thereby generate a sequence of output samples, wherein the truncating comprises performing adaptive truncation where a value of k is modified in order to truncate a variable number of least significant bits from the filtered samples;
wherein performing the adaptive truncation comprises:
determining a power of each filtered sample;
adjusting a variable gain factor in response to the determination; and
multiplying each of the filtered samples by the variable gain factor to generate a sequence of shifted samples, wherein a most significant bit of each filtered sample is shifted to a desired bit position.

16. The method as set forth in claim 15, wherein performing the adaptive truncation further comprises:
truncating a fixed number of least significant bits from each shifted sample to thereby generate a sequence of truncated samples.

17. The method as set forth in claim 16, wherein performing the adaptive truncation further comprises:
clipping ones of the truncated samples exceeding a positive maximum threshold at a positive saturation value and clipping ones of the truncated samples exceeding a negative maximum threshold value at a negative saturation value to thereby generate the sequence of output samples.

18. The method as set forth in claim 15, wherein generating the intermediate signal comprises:
multiplying the input samples by filter coefficients to generate intermediate products; and
summing the intermediate products to generate the filtered samples.

19. The method as set forth in claim 18, wherein multiplying the input samples by the filter coefficients comprises using N−1 delay elements coupled in series and N multipliers.

20. The method as set forth in claim 19, wherein the multipliers comprise:
N−1 multipliers, each coupled to an input of one of the delay elements; and
an $N^{th}$ multiplier coupled to an output of a last of the delay elements.

* * * * *